United States Patent [19]

Pinkham

[11] Patent Number: 5,801,569
[45] Date of Patent: Sep. 1, 1998

[54] OUTPUT DRIVER FOR MIXED SUPPLY VOLTAGE SYSTEMS

[75] Inventor: Ray Pinkham, San Jose, Calif.

[73] Assignee: Hyundai Electronics America, San Jose, Calif.

[21] Appl. No.: 867,465

[22] Filed: Jun. 2, 1997

Related U.S. Application Data

[63] Continuation of Ser. No. 550,586, Oct. 31, 1995, abandoned.

[51] Int. Cl.$^6$ ............................................. H03L 5/00
[52] U.S. Cl. ............................ 327/333; 327/530; 327/536
[58] Field of Search ............................ 326/62, 63, 68, 326/80, 81, 113; 327/319, 333, 530, 534, 535, 536

[56] References Cited

U.S. PATENT DOCUMENTS

| | | | |
|---|---|---|---|
| 4,656,369 | 4/1987 | Lou | 327/536 |
| 4,667,313 | 5/1987 | Pinkham et al. | 365/240 |
| 4,689,495 | 8/1987 | Liu | 326/62 |
| 4,961,171 | 10/1990 | Pinkham et al. | 365/230.05 |
| 5,128,560 | 7/1992 | Chern et al. | 326/81 |
| 5,321,324 | 6/1994 | Hardee et al. | 307/475 |

OTHER PUBLICATIONS

Furutani et al., "An Adjustable Output Driver with a Self–Recovering Vpp Generator for a 4M×16 DRAM," *IEEE Journal of Solid–State Circuits*, 29:308–310 (Mar., 1994).

*Primary Examiner*—Timothy P. Callahan
*Assistant Examiner*—Jeffrey Zweizig
*Attorney, Agent, or Firm*—Townsend and Townsend and Crew LLP

[57] ABSTRACT

An output driver for mixed voltage systems includes an input line for receiving a signal to be output. The circuit also includes an overvoltage generator, coupled between the input line and an output stage. The overvoltage generator boosts a level of the signal to a second voltage before it reaches the output stage. A restore circuit is also provided which restores the second voltage with every transition of the input signal.

13 Claims, 3 Drawing Sheets

OUTPUT DRIVER FOR MIXED SUPPLY VOLTAGE SYSTEMS

This is a Continuation of application Ser. No. 08/550,586, filed Oct. 31, 1995 now abandoned, the disclosure of which is incorporated by reference.

BACKGROUND OF THE INVENTION

The present invention generally relates to output driver stages for use in integrated circuits. Particularly, the invention relates to an NMOS only output driver stage for use in mixed supply voltage systems.

Advances in design and fabrication have allowed manufacturers to produce semiconductor devices having transistors smaller than 0.6 µm in size. By packing greater numbers of transistors onto each chip, manufacturers are able to create very high performance chips. The advent of sub 0.6 µm transistors, due to their lower power consumption requirements, also has led to the use of mixed supply voltage systems. In the past, most devices consistently used 5 Volts as the standard (TTL) supply voltage. Now, many devices operate with low voltage TTL (LVTTL) supply voltage, which is 3.3 Volts. Throughout this discussion, 5 and 3.3 Volt mixed systems will be described; however, those skilled in the art will recognize that systems having other mixed voltages may also utilize the concepts of the present invention.

Many memory chips now operate using LVTTL voltage. Proper integration of these devices into systems requires that the memory function with other devices, which may not be LVTTL voltage devices. Often, a LVTTL memory device is called upon to interact with 5 Volt chips or devices. In this example, the memory must be capable of being driven by the TTL device.

CMOS output drivers are commonly used in CMOS circuits. When a single voltage level and ground are used, CMOS circuits offer smooth and symmetrical signal transitions. However, when mixed supply voltages are used, CMOS drivers suffer from undesirable leakage current which could lead to latchup and device failure.

NMOS-only output drivers have been used as an alternative to CMOS-only drivers. NMOS drivers are essentially immune to the latchup and leakage problems associated with CMOS. However, NMOS drivers are inferior in their performance in reaching a logic high level for typical TTL and LVTTL loading conditions. Designers have taken two approaches to minimizing these deficiencies of NMOS pull-up driver transistors.

In one approach, the gate of a pull-up transistor is boosted above the supply voltage by a local bootstrap circuit which first establishes a voltage approximately equal to the supply voltage on a positive plate of a capacitor and a voltage near ground on the negative plate of the same capacitor. The circuit then boosts the negative plate from near ground to near the supply voltage, coupling the positive plate, which is connected to the gate of the NMOS pull-up transistor, above the supply voltage. However, this bootstrap technique suffers in that additional power dissipation and delay through the critical path is incurred to precharge the capacitor before booting. As the number of outputs increases, the power dissipation grows accordingly. Thus, this approach is unsatisfactory for designs having a large number of outputs (e.g., greater than eight).

In the second method, a separate "overvoltage" generator maintains a node at a voltage above the power supply voltage by use of capacitively coupled pump circuits. This node is switched onto the gate nodes of NMOS pull-up transistors as or just after that node makes a low to high signal transition associated with driving the output node from a logic low level to a logic high level. This technique suffers in that the current drawn by the output circuits from the overvoltage generator is dependent upon: (1) The number of outputs switching from a logic level zero to a logic level one; and (2) the operating frequency of the device.

The greater the number of zero to one transitions, the more current will be drawn by the overvoltage generator. In practice, this causes the boosted node to lose voltage, which in turn degrades the performance of the output circuit. Likewise, as the operating frequency is increased, more zero to one transitions occur in a given time period, and the overvoltage pump must supply more current. This causes voltage to be lost as the current is increased, thereby further degrading performance of the output drivers. Therefore, the overvoltage generator must be designed to react to the worst case condition of all outputs on the chip transitioning simultaneously from a logic low level to a logic high level, and must also be designed to react to the highest operating frequency that the device will ever be operated at, either in a test mode or in its intended application. Clearly, these worst case scenarios are associated with a pump circuit which draws more current, both in active mode and in standby mode, and consumes more silicon area. The problem is compounded as the number of outputs increases.

Furutani, et al. in "An Adjustable Output Driver with a Self-Recovering Vpp Generator for a 4M×16 DRAM", IEEE Journal of Solid State Circuits, March 1994, describe an approach to mitigating this drawback by supplementing an overvoltage generator with local pump circuits at each output driver. In the Furutani reference, local charge pumps supply additional positive charge to the boosted node of the overvoltage generator whenever the output transitions from a zero to a one. However, this technique is also unsatisfactory as positive charge is supplied by the local pumps only on positive data transitions. Because of this, the local pump circuits, and in some situations the master overvoltage generator itself, must be made larger and tend to consume more current. They also occupy a large amount of valuable substrate area. Thus, it would be advantageous to provide a system which allows improved efficiency and which allows the use of smaller pumps.

Furthermore, the Furutani reference does not provide a description of how the boosted node is coupled to the gate of the NMOS pull-up transistor during zero to one transitions. The switching of overvoltage to the gate of the NMOS pull-up transistor is, apparently, of conventional design. Existing systems switch the overvoltage inefficiently in a manner which tends to further degrade the overvoltage slightly. Thus, it is also desireable to provide a driver which efficiently switches a boosted voltage onto the gate of an output NMOS transistor without degradation.

Accordingly, an output driver for mixed supply voltage operation is needed which preserves the output voltage under high frequencies of operation in devices which have a large number of outputs subject to switching at any time. Preferably, the output driver may be easily integrated into existing device designs without using excessive substrate area.

SUMMARY OF THE INVENTION

According to the invention, an output driver for mixed voltage systems includes an input line for receiving a signal to be output. The circuit also includes an overvoltage generator, coupled between the input line and an output stage. The overvoltage generator boosts a level of the signal to a second voltage before it reaches the output stage. A restore circuit is also provided which restores the second voltage with every transition of the input signal.

Output drivers according to the present invention permit use of NMOS transistor pairs in the output stage, thereby taking advantage of their inherent immunity to latchup and leakage. The restore circuit avoids the incremental deterioration of the first voltage caused by each signal transition. The circuit of the present invention is relatively immune to cumulative charge losses and is independent of operating frequency, making the circuit particularly useful in applications requiring high frequency outputs. The circuit ensures the first voltage is relatively immune to cumulative charge losses and is independent of the number of output drivers deployed on a chip.

The restore circuits of embodiments of the present invention are responsive to every transition of an input signal, thereby restoring charge on every data transition. This doubles the charge restoration capacity of the restore circuit for a given silicon area consumed by the restore circuit or, alternatively, may allow the circuit to consume less area for a given charge restoration capacity.

Embodiments of the present invention also avoid degradation of the overvoltage supply by minimizing the charge share required when the gate of an output transistor is boosted to the overvoltage. This is accomplished, e.g., by ensuring that the gate of the output transistor is placed at or above the lower voltage level immediately before boosting the gate to the higher level. This results in improved performance, and minimizes degradation of the overvoltage supply.

For a fuller understanding of the nature and advantages of the invention, reference should be made to the ensuing description taken in conjunction with the accompanying drawings.

DESCRIPTION OF SPECIFIC EMBODIMENTS

Figure 1:
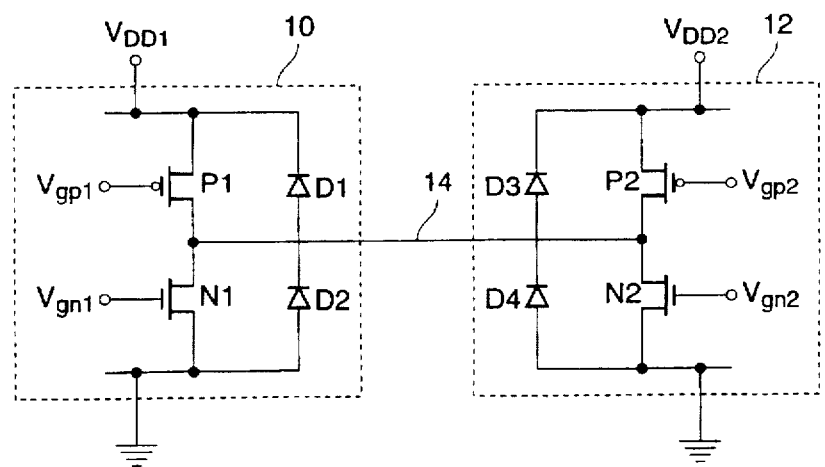
FIG. 1 is a circuit diagram showing conventional CMOS output driver circuitry.

As mentioned, a number of driver circuits have been used by system designers. These existing designs suffer from certain deficiencies when used in mixed supply voltage systems. These shortcomings will now be described by first referring to FIG. 1, where a conventional CMOS driver circuit in a device 10 is shown coupled to a device 12 using another CMOS driver circuit. Device 10 is coupled to a first supply voltage VDD1 (e.g., 3.3 Volts) while device 12 is coupled to a second supply voltage VDD2 (e.g., 5 Volts). The two devices are coupled via signal line 14. The CMOS driver circuits on each device 10, 12 include a pull-up PMOS transistor P1, P2 and an NMOS transistor N1, N2. The source and drain of the two transistor pairs are coupled via output line 14. Diodes D1–D4 are shown across each transistor to represent N/P junctions in the device substrate or wells diffused in the face of the device substrate which may function as diodes. For example, D1 and D3 are diodes formed in the substrate between the P+ drain terminals of the PMOS transistors P1/P2 and the N well of those transistors.

If the output line 14 is driven sufficiently above VDD1 by device 12, device 12 having greater supply voltage VDD2, diode D1 will become forward biased, and undesired leakage current will flow from line 14 to source VDD1 through the high resistance N well of PMOS transistor P1. Additional leakage current will flow from the drain of transistor P1 (node 14) to the source of transistor p1 (VDD1), since the gate voltage of transistor P1 in disabled state is VDD1 and the source voltage is VDD2 which is greater than VDD1 plus a threshold voltage. Diode D1 also forms the base emitter junction of a parasitic PNP transistor, which, as is known in the art, is in turn embedded in the PNPN semiconductor-controlled rectifier (SCR) inherent to conventional CMOS structures. In the case where leakage current flows through D1, the parasitic PNP transistor may turn on sufficiently to cause latchup. Thus, CMOS-only driver circuits are undesirable in mixed supply voltage systems, especially where the supply voltage varies by more than 1 Volt (e.g., in TTL/LVTTL systems).

Figure 2:
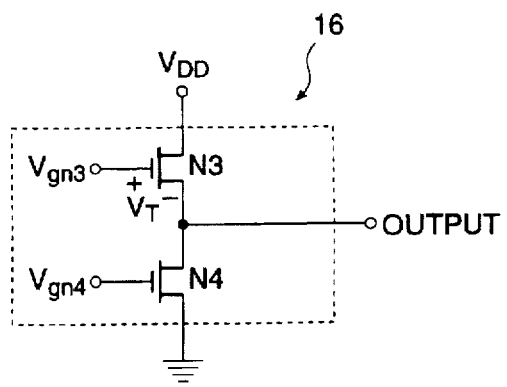
FIG. 2 is a circuit diagram showing conventional NMOS output driver circuitry.

FIG. 2 depicts a conventional NMOS driver circuit 16. The circuit consists of two NMOS transistors N3, N4 connected so that the NMOS pull-up transistor N3 operates in source follower mode. While such a driver circuit configuration is immune to latchup and leakage currents caused by overvoltages, the device's ability to reach a logic high level in mixed voltage systems is limited. Because the pull-up transistor N3 must operate in source follower mode, there is no voltage gain through the driver stage. Further, a voltage equal to the threshold voltage $V_T$ of transistor N3 is lost between the gate and the source of the transistor N3, even when no load current is flowing. The output signal level capacity is further reduced as the threshold voltage VT tends to rise under the so called "body effect" (when the source voltage increases relative to the P bulk node of the substrate). For at least these reasons, NMOS-only driver circuits such as the one shown in FIG. 2 are undesirable in mixed supply systems.

Figure 3:
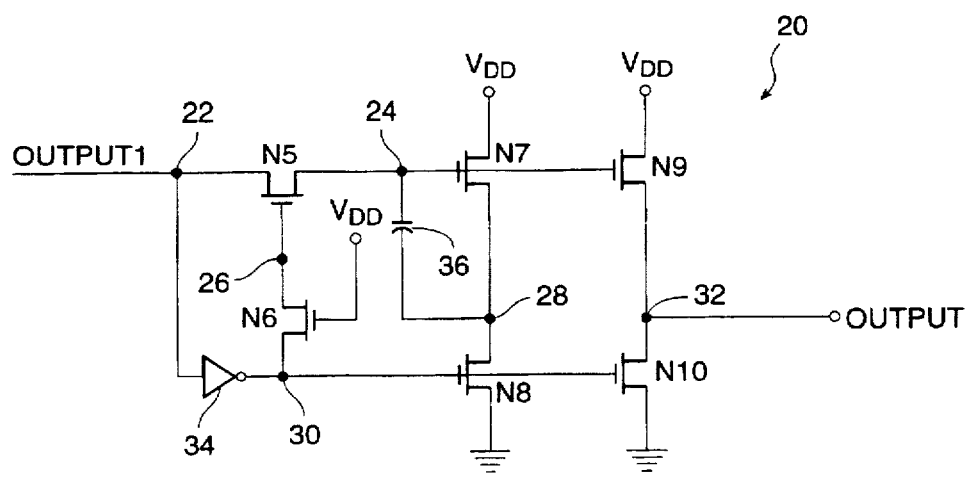
FIG. 3 is a circuit diagram showing conventional booster circuitry for an NMOS output driver circuit.

Bootstrap circuits, such as the circuit 20 shown in FIG. 3, have been used to compensate for the threshold voltage loss from the gate to the source of the pull-up transistor. In general, the bootstrap circuit 20 functions to boost the gate voltage of the output pull-up transistor N9 to a voltage level greater than VDD such that the output node 32 achieves a potential of VDD despite losing a threshold voltage from the gate to the source. By boosting the gate voltage, the source (i.e., OUTPUT) voltage can be driven higher for a given load even after allowing for the threshold voltage drop. While the output logic high level is improved through the boosting action of node 24, a finite delay is incurred to allow node 24 to charge the top plate of the capacitor 36 to VDD while the bottom plate (node 28) is held near ground. Only after capacitor 36 is sufficiently charged can node 30 fall, releasing node 28 and causing node 24 to be boosted well above VDD. Furthermore, while the capacitor 36 is charging, significant current is flowing through transistors N7–N10. To make matters worse, while the capacitor is charging, N7 and N9 are saturated, potentially giving rise to significant charge injection into the substrate and gate oxide. On devices having a large number of outputs all switching at once, the currents could become prohibitively large with respect to target specifications or could even cause circuit failure. Thus, these "boosting" circuits are not ideal for use in many mixed supply voltage systems.

To improve performance while substantially reducing current draw and related charge injection, designers have resorted to using separate boosted voltage, or "overvoltage" generators, the outputs of which are switched onto the gates of the output NMOS pull-up transistors all at once without the need for charging any bootstrap capacitors. Instead, the overvoltage is typically generated from capacitive pumping circuits which are known to those reasonably skilled in the art. These overvoltage generators, unfortunately, by nature have significantly high output impedance, owing to the lack of a dc current path to any voltage equal to or greater than the output overvoltage. Consequently, such overvoltage generators have very limited current drive capability. The overvoltage, therefore, is degraded by the reactive load currents arising from switching the gate of the NMOS pull-up transistors from, say, VDD-VTN, to the boosted voltage. Previous systems using overvoltage generators have also failed to efficiently couple the boosted voltage to the gate of the pull-up transistors. These prior devices, thus, draw more current from the overvoltage generator and any local pump circuits, and generally consume a relatively large amount of valuable substrate area.

Figure 4:
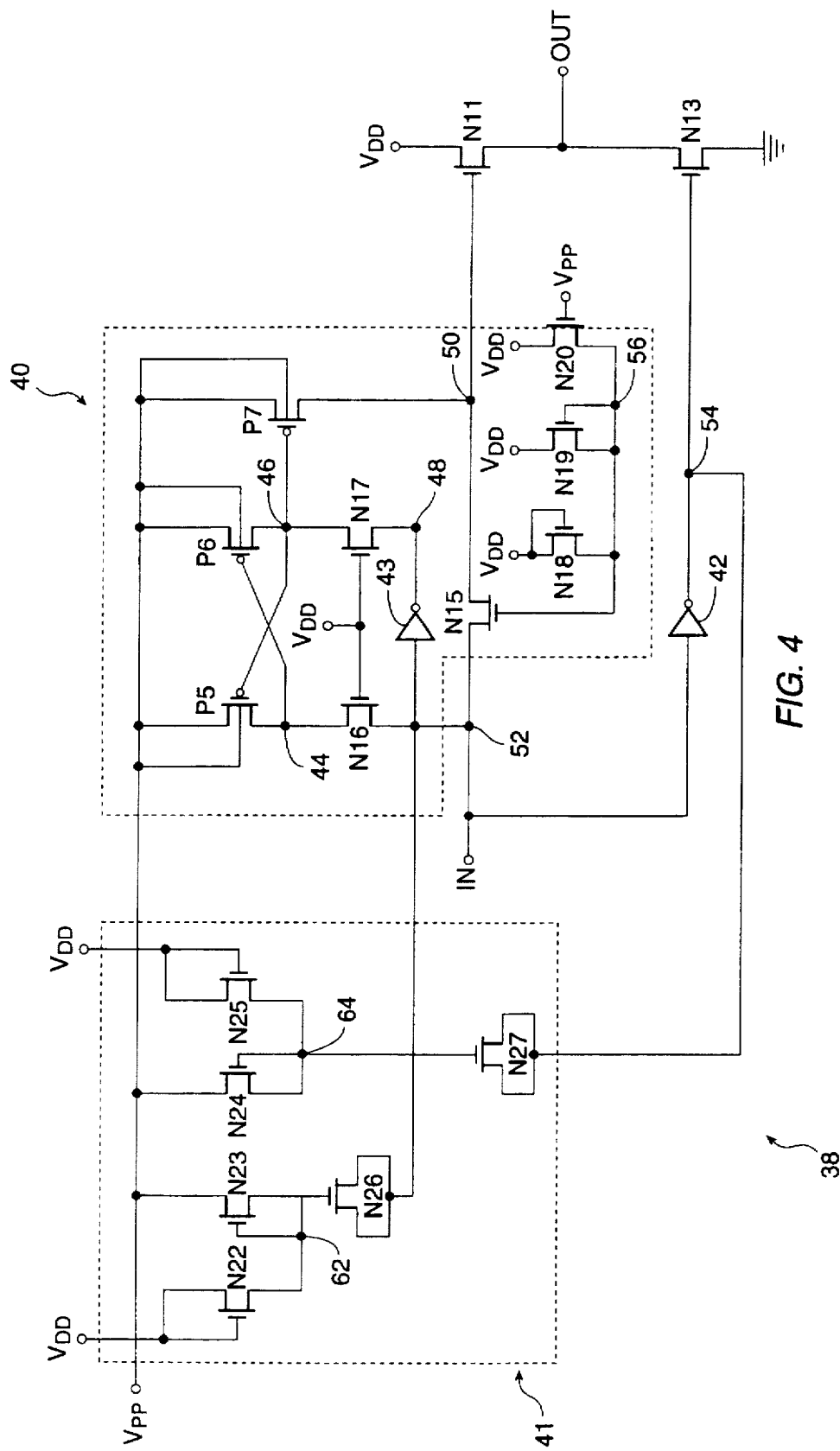
FIG. 4 is a circuit diagram depicting an NMOS driver circuit using an embodiment of the present invention.

Output driver circuits according to the present invention resolve these and other deficiencies by employing features which will now be discussed by referring to FIG. 4. An output driver circuit 38 according to one specific embodiment of the present invention employs an overvoltage (VPP) switched onto the gates of NMOS pull-up driver transistor N11. The overvoltage is switched onto the gates under control of switching circuit 40. Operation of the output driver circuit 38 will be described by first describing the overvoltage switching provided by switching circuit 40.

The output driver 38 responds to signal transitions on signal line IN which may be, e.g., a data carrying line such as an output of a memory device. A number of these output drivers may be placed on a memory chip to accommodate each output line. The switching circuit 40 of the output driver responds to transitions on input line IN as follows. The transition from low to high on line IN causes node 54 to go low, turning off NMOS pull-down transistor N13. Node 52 rising causes NMOS transistor N16 to turn off and node 48 to go low, grounding the source of NMOS transistor N17. N17 thus turns on, and pulls node 46 to ground, turning on PMOS transistor P5 to pull node 44 to VPP, turning off transistor P6 while turning on PMOS transistor P7 and connecting the gate (node 50) of the NMOS driver pull-up transistor N11 to the overvoltage VPP. By the time PMOS transistor P7 is turned on, node 50 has been charged to a level at or above VDD by the conduction of NMOS pass transistor N15. This is accomplished, in embodiments of the present invention, through the use NMOS transistors N18-N20.

The gate of transistor N15 self boots momentarily above VDD in response to the low to high transition of node 52, allowing node 50 to rise above VDD-VT to VDD. Self booting occurs when the inherent parasitic gate-source capacitance (CGS) of FET N15 couples the voltage pulse arriving on the input at node 52 to the gate of N15, which is node 56, when the gate is at or near VDD. Self booting is similar to the operation of a bootstrap circuit, described above in conjunction with FIG. 3. In this instance, CGS is the capacitor. The FET gate is charged to or near VDD, and the FET source is held near ground (prior to a low-to-high transition). After CGS is fully charged, a low-to-high transition on the input pumps the FET gate, self booting the gate voltage above VDD. This is accomplished by use of a transistor N20 which is gated by the overvoltage VPP. Node 56 is returned to VDD quickly and efficiently after self booting by transistor N20. N20 is gated by VPP, and therefore allows node 56 to reach the full VDD. Transistors N18 and N19 are configured as complimentary MOS diodes, which are discussed in further detail below in conjunction with the restore circuit, and serve to limit the maximum and minimum excursions from VDD of the voltage at node 56 to VDD±VT. This allows N20, which is operating as a resistor, to quickly restore node 56 to VDD. Isolating node 56 from VDD with the resistive N20 allows node 56 to be momentarily self booted above VDD, which typically has a relatively low impedance that might otherwise preclude self booting, to allow the full IN signal to be transferred to node 50, thus reducing the draw on the overvoltage generator.

In previous overvoltage generators, when overvoltage was switched onto the gate of the NMOS pull-up transistor, charge share occurred between the overvoltage and the gate, which was typically below VDD, e.g., at or below VDD-VT. This tended to cause VPP to degrade slightly.

In embodiments of the present invention, when input signal IN switches back low, node 52 goes low, pulling node 50 low through N15. Meanwhile, N16 has turned back on, pulling node 44 low and pulling node 48 high. This action is intended to turn PMOS transistor P7 off as quickly as possible before the downward transition of node 50 pulls additional charge off of VPP. In practice, complete avoidance of this additional charge transfer does not occur, and VPP suffers from further degradation.

Figure 5:
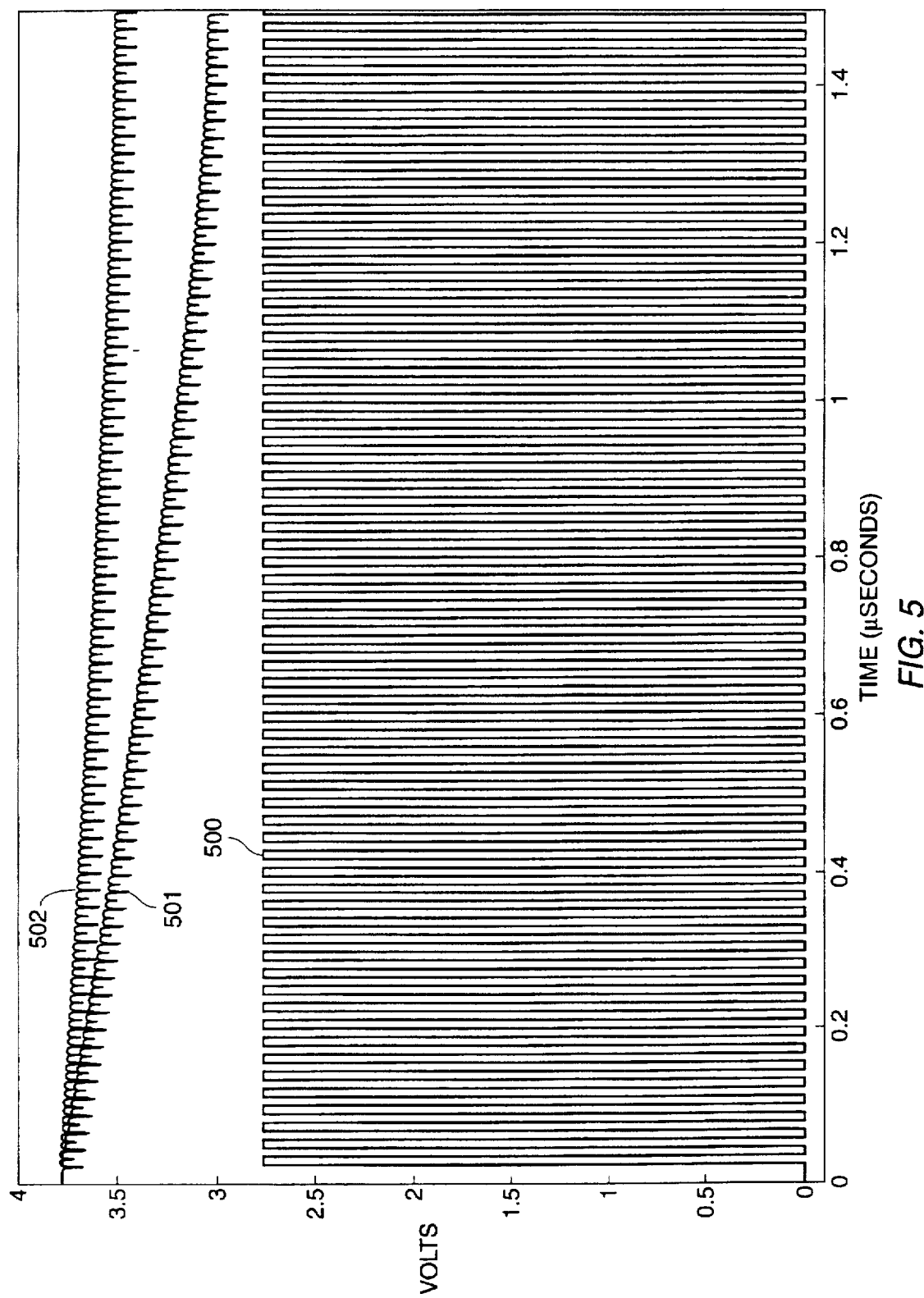
FIG. 5 is a timing diagram comparing overdrive voltage over time for prior art circuits and the circuit of FIG. 4.

Previous devices did not compensate for this degradation. If the frequency of operation is slow enough (several tens or hundreds of nanoseconds), the VPP generator will restore VPP to its original voltage level before VPP is again coupled to the gate of the NMOS pull-up transistor. If, however, the operating frequency is high (e.g., less than 25 nanoseconds), full recovery will not occur, and the VPP voltage will be incrementally reduced on every low to high and high to low transition of line IN until the gate of the pull-up transistor reaches an equilibrium voltage obtained when the average drive current of the VPP generator just matches the average load current emanating from VPP. FIG. 5 shows a simulation of the VPP voltage 501 at approximately 20 nanosecond cycle time 50 and depicts the gradual deterioration of VPP to some equilibrium level below its original level. Previous overvoltage generators did not compensate for this degradation.

These and other deficiencies of existing systems are resolved through use of the restore circuit 41 according to the present invention. A VPP restore circuit 41 is added to each output driver circuit 38 and each switching circuit 40, as shown in FIG. 4. The restore circuit 41 provides a restore action on the overvoltage VPP for both low to high and high to low transitions of signal IN, so that the VPP pump and capacitors N26 and N27 can be made smaller. Furthermore, the restore circuit 41 pumps at the same frequency as the data to the driver circuit (signal IN) changes, ensuring the relative immunity of VPP to cumulative degradation regardless of the data rate. By including such a local restore circuit 41 in each driver circuit, VPP becomes relatively immune to cumulative degradation, independent of the number of driver circuits included on the chip.

With signal line IN low, node 52 is low and node 54 is high. At this time node 62 is precharged to some high level, low impedance voltage supply voltage (here, designated VDD). This voltage is assumed in this case to be VbD but this should not be construed in a limiting sense. The voltage can either be VDD or the output of some other voltage supply with an output voltage greater than VDD located either on the chip or external to the chip. Indeed, the external voltage signal could be coupled to VPP, the output of the primary overvoltage generator. In this case, again, VDD is used. NMOS capacitor N26 is therefore precharged with voltage VDD-VT across it.

When line IN switches high, node 52 switches high, attempting to boost node 62 to VDD-VT+VDD=2VDD-VT. When node 62 reaches VPP+VT, positive current flows from node 62 to VPP, acting to raise VPP and restore the charge lost due to PMOS transistor P7 turning on as described in the previous section. Concurrent to these events, node 54 is pulled low. This couples node 64 toward ground, but node 64 is immediately restored to VDD-VT through forward diode configured MOSFET N25. The downward coupling of node 64 is prevented from affecting VPP due to the blocking action of reverse diode configured MOSFET N24.

When line IN switches back low, node 52 goes low, coupling node 62 toward ground. Node 62 is immediately restored to VDD-VT via forward diode configured MOSFET N22, while reverse diode configured transistor N23 prevents the negative transition on node 62 from affecting VPP. Meanwhile, node 54 goes high, attempting to boost node 64 to 2VDD-VT. When node 64 reaches VPP+VT, forward diode configured MOSFET N24 supplies positive current to VPP, acting to raise VPP and provide additional restore of the charge lost on VPP when transistor P7 turned on during the previous cycle. While this additional restore action is occurring, PMOS transistor P7 is turned off as described in the previous section.

The operation of the restore circuit 41 in conjunction with the output driver 38 repeats for each low to high (and subsequent high to low) transition of line IN. The result is a compact and efficient circuit which avoids the erosion of overvoltage suffered by prior art circuits. FIG. 5 shows the Vpp of output drivers using the circuits of the presents invention (502) overlayed on the Vpp produced by output drivers without the present invention (501). The response of the overvoltage node VPP is greatly improved by the action of the novel restore circuit 41.

Those skilled in the art will recognize that the embodiment of the present invention described may be implemented in a number of other ways to attain the restoration of VPP. Further, the circuit could be adapted to function with active low or active high signals. The circuit could also be adapted to be positive and/or negative edge triggered. Accordingly, the disclosure of the invention is intended to be illustrative, but not limiting, of the scope of the invention which is set forth in the following claims.

What is claimed is:

1. An output driver for mixed voltage systems, comprising:
    an input line for receiving an input signal at a first voltage;
    an overvoltage generator, coupled between said input line and an output stage, for switching an output signal at a node of said output stage, said output signal having a second, higher voltage than said input signal; and
    a restore circuit, coupled to said overvoltage generator and said output stage, for restoring said second voltage with every low to high and every high to low transition of said input signal.

2. The output driver of claim 1, wherein said output stage comprises NMOS pull-up and pull-down transistors.

3. The output driver of claim 1, wherein said overvoltage generator further includes:
    a switch, coupled between said input line and said node of said output stage, said switch operative to place said node at said first voltage upon a low to high transition of said input signal.

4. The output driver of claim 3, wherein said overvoltage generator further includes:
    means, coupled between a voltage source at said second voltage and said node of said output stage, for placing said node at said second voltage after said switch has placed said node at said first voltage.

5. A method for outputting a signal in a mixed supply voltage system, the method comprising the steps of:
    receiving, at a first node, an input signal at a first voltage level, said first node coupled to an overvoltage generator and to a switching device, said switching device and said overvoltage generator both coupled to a second node;
    operating said switching device to place said second node at or above said first voltage level;
    operating said overvoltage generator to raise second node to a second, higher voltage level; and
    boosting, substantially simultaneously with said step of operating said overvoltage generator, a voltage source supplying said second voltage level.

6. The method of claim 5 further comprising the step of repeating said step of boosting said voltage source with every transition of said input signal.

7. The method of claim 5, wherein said second node is coupled to the gate of an NMOS pull-up transistor.

8. In a memory device having a first supply voltage, an output driver circuit for outputting data on an output line at a second supply voltage, the driver circuit comprising:
    a transistor having a source coupled to an input data line for receiving input data at said first supply voltage, a drain coupled to a first node, and a gate with a rate voltage nominally at said first supply voltage and placed temporarily above said first supply voltage in response to low to high transitions on said source of said transistor, thereby allowing said first node to be placed substantially at said first voltage level when said input data is received;
    an overvoltage generator, coupled between said second supply voltage and said first node, for placing said first node at said second voltage level after said first node has been placed substantially at said first voltage level; and
    a restore circuit, coupled between said first and second supply voltages, for restoring said second supply voltage with every low to high and every high to low transition of said input data.

9. The memory device of claim 8 further comprising:
    a resistive switch coupled between said first supply voltage and said gate of said transistor;
    wherein said gate is returned to said first voltage level after said first node has been placed at said first voltage level.

10. The memory device of claim 8 further comprising an NMOS pull-up transistor having a gate coupled to said first node.

11. In a memory device having a first supply voltage, an output driver circuit for outputting data on an output line at a second supply voltage, the driver circuit comprising:
    a transistor having a source coupled to an input data line for receiving input data at said first supply voltage, a drain coupled to a first node, and a gate with a gate voltage nominally at said first supply voltage and placed temporarily above said first supply voltage in response to low to high transitions on said source of said transistor, thereby allowing said first node to be placed substantially at said first supply voltage level when said input data is received, wherein said gate voltage is returned to said first supply voltage level through a resistive switch coupled between said first supply voltage and said gate of said transistor after said first node has been placed at said first supply voltage level;

an overvoltage generator, coupled between said second supply voltage and said first node, for placing said first node at said second voltage level after said first node has been placed substantially at said first supply voltage level; and a restore circuit, coupled between said first and second supply voltages, for restoring said second supply voltage with every transition of said input data.

12. A memory device having a first supply voltage and an output driver circuit for outputting data on an output line at a second supply voltage, the output driver circuit comprising:

an input line for receiving an input signal at a first signal voltage;

an overvoltage generator coupled between said input line and said output line through a switching circuit, and said switching circuit including a switch, said switch turning off in response to a high-to-low transition on said input line to limit charge transfer from said overvoltage generator to said input line.

13. The output driver circuit of claim 12 wherein said switch is a p-channel field effect transistor.

* * * * *